United States Patent
Simon et al.

(10) Patent No.: US 12,401,218 B2
(45) Date of Patent: Aug. 26, 2025

(54) DYNAMIC BATTERY CHARGING SYSTEM AND METHOD, AND BATTERY CHARGING DEVICE

(71) Applicant: THE NOCO COMPANY, Glenwillow, OH (US)

(72) Inventors: Daniel L. Simon, Phoenix, AZ (US); James Richard Stanfield, Glendale, AZ (US)

(73) Assignee: The Noco Company, Glenwillow, OH (US)

( * ) Notice: Subject to any disclaimer, the term of this patent is extended or adjusted under 35 U.S.C. 154(b) by 310 days.

(21) Appl. No.: 17/904,170

(22) PCT Filed: Feb. 11, 2021

(86) PCT No.: PCT/US2021/017602
§ 371 (c)(1),
(2) Date: Aug. 12, 2022

(87) PCT Pub. No.: WO2021/163286
PCT Pub. Date: Aug. 19, 2021

(65) Prior Publication Data
US 2023/0080880 A1     Mar. 16, 2023

Related U.S. Application Data

(60) Provisional application No. 62/976,463, filed on Feb. 14, 2020.

(51) Int. Cl.
*H02J 7/00*     (2006.01)
*G01R 31/3842*  (2019.01)

(52) U.S. Cl.
CPC .... *H02J 7/007182* (2020.01); *G01R 31/3842* (2019.01); *H02J 7/00714* (2020.01)

(58) Field of Classification Search
CPC .......... H02J 7/007182; H02J 7/00714; G01R 31/3842
See application file for complete search history.

(56) References Cited

U.S. PATENT DOCUMENTS

| | | | |
|---|---|---|---|
| 9,762,069 B2 * | 9/2017 | Bourilkov | H02J 7/0068 |
| 11,431,037 B2 * | 8/2022 | Yazami | H02J 7/0048 |

(Continued)

FOREIGN PATENT DOCUMENTS

| | | |
|---|---|---|
| CN | 2018-46097 | 5/2011 |
| CN | 102204059 | 9/2011 |

(Continued)

OTHER PUBLICATIONS

Serhan et al. "Effect of the different charging techniques on battery life-time: Review," 2018 International Conference on Innovative Trends in Computer Engineering (ITCE). Proceedings: 421-6. IEEE. (2018) (Year: 2018).*

(Continued)

*Primary Examiner* — Lee E Rodak
*Assistant Examiner* — Sangkyung Lee
(74) *Attorney, Agent, or Firm* — Jones Day

(57) ABSTRACT

A dynamic battery charging method for use in a battery charger configured to charge a lead acid battery, including marking a time when battery charger switches from Constant Current (CC) phase to Constant voltage (CV) phase to establish CV Start Time; starting at CV Start Time; calculating Delta Current by subtracting current measurement at particular time interval from previous current measurement at an earlier time interval; terminating CV phase once Delta Current is less than or equal to a particular Delta Current current level OR once the battery charger operating current drops below a particular battery charger operating current; marking CV Finish Time; switching back to another CC (Continued)

phase once CV phase is terminated; and staying at another CC phase for a time period equal to the CV Finish Time minus CV start Time OR until lead acid battery reaches CV voltage plus an additional voltage amount to complete charging.

17 Claims, 1 Drawing Sheet

(56) References Cited

U.S. PATENT DOCUMENTS

| | | | |
|---|---|---|---|
| 2003/0006735 A1 | | 1/2003 | Kawakami et al. |
| 2005/0007075 A1 | | 1/2005 | Woo et al. |
| 2006/0192531 A1 | | 8/2006 | Nishida |
| 2007/0139011 A1 | * | 6/2007 | Lin .................. H02J 7/0071 320/128 |
| 2008/0203974 A1 | | 8/2008 | Manai et al. |
| 2010/0102781 A1 | * | 4/2010 | Svensson ............ H02J 7/00718 320/157 |
| 2010/0148731 A1 | | 6/2010 | Notten et al. |
| 2010/0253281 A1 | | 10/2010 | Li |
| 2012/0081068 A1 | | 4/2012 | Odaohhara et al. |
| 2017/0288417 A1 | | 10/2017 | Trichy |
| 2019/0170830 A1 | * | 6/2019 | Ohkanda .......... G01R 19/16542 |
| 2020/0025832 A1 | * | 1/2020 | Cho .................. G01R 31/392 |

FOREIGN PATENT DOCUMENTS

| | | |
|---|---|---|
| CN | 102130368 | 5/2013 |
| CN | 109075583 | 12/2018 |
| WO | WO 1996/024979 | 8/1996 |
| WO | WO 2012/054864 | 4/2012 |

OTHER PUBLICATIONS

Patent Cooperation Treaty, PCT/US2021/017602, International Search Report and Written Opinion, Apr. 21, 2021.
IP India, Appl. 202237045196, Examination Report, Mar. 1, 2023.
IP Australia, Appl. 2021218589, Examination Report, Mar. 9, 2023.
European Patent Office, Appl. 21754631.6, Extended European Search Report, Feb. 21, 2024.
Canadian Intellectual Property Office, Appl. 3,170,979, Examination Report, Sep. 12, 2023.
Japan Patent Office, Appl. 2022-548999, Decision of Refusal, Sep. 5, 2023.
CNIPA, Appl. 202180013999.1, First Office Action, Aug. 9, 2024.
IP Australia, Appl. 2023226751, Examination Report No. 1, Oct. 9, 2024.
European Patent Office, Appl. 21754631.6, Office Action, Nov. 11, 2024.
European Patent Office, Appl. 21754631.6, Office Action, Mar. 11, 2025.
CNIPA, Appl. 202180013999.1, Second Office Action, May 28, 2025.

* cited by examiner

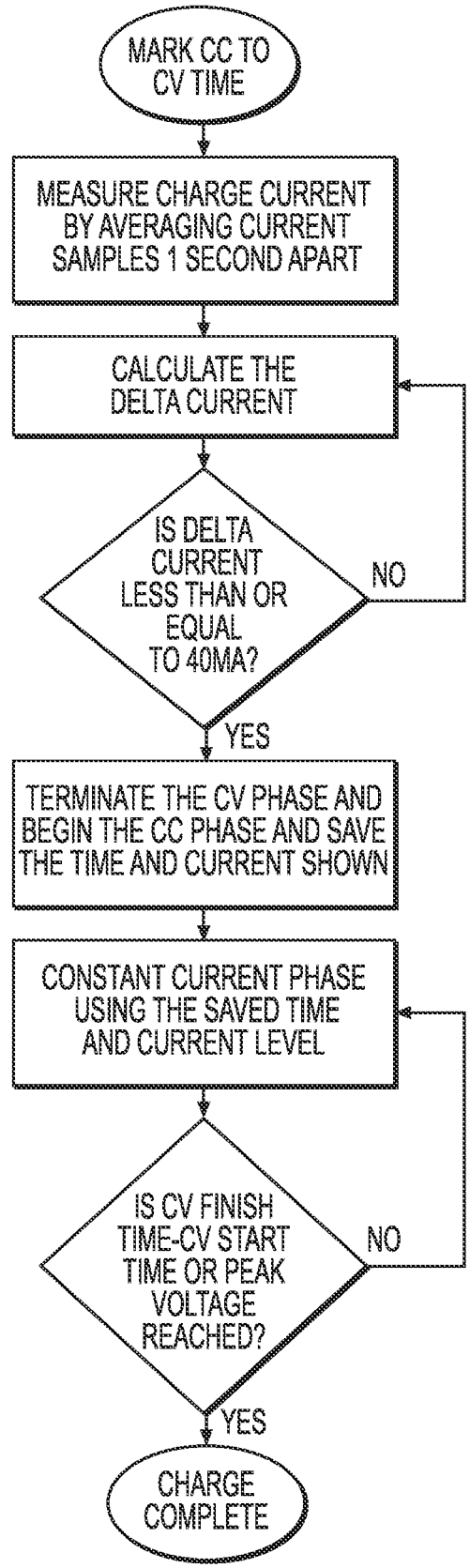

DYNAMIC BATTERY CHARGING SYSTEM AND METHOD, AND BATTERY CHARGING DEVICE

FIELD

The present invention is directed to a dynamic battery charging system and method, and a battery charging device including or incorporating the dynamic battery charging method according to the present invention.

BACKGROUND

Lead Acid battery technology is over 100 years old. Battery companies have improved the technology over the years but many of the problems that the original batteries had, still exist today. For example, Lead Acid batteries tend to age rapidly and lose capacity because of sulfation (i.e. a buildup of lead sulfate crystals on battery plates) and other issues. One of the main methods used to fight these problems is properly charging the batteries.

Charging Lead Acid batteries presents many challenges, particularly at the end of charge. Smart chargers have provided improvement, but still have many limitations. Some of those limits are listed below:
1) The termination of Taper Charge (Absorption) is not ideal. For some Lead Acid batteries it is too early, and for other Lead Acid batteries it is too late. Currently, hard coded thresholds for Specific Gravity Optimization Current Threshold being used are currently fixed values. Instead, it is desired to make this threshold variable based on how the charger current changes over time.
2) Currently, the Optimization step is too long because the Specific Gravity/Maintenance current is too low. This leads to very long charge times.
3) Trying to charge a Lead Acid battery that is only slightly discharged makes the charger go to specific gravity optimization which leads to very long charge time.

The variation in battery sizes as well as plate damage adds to this challenge. A new Dynamic Battery Charging method is desired to help address these challenges.

SUMMARY

The present invention is directed to a system and method for dynamic battery charging, and an improved battery charger incorporating the system and/or method.

The method comprises or consists of a number of steps for reducing the time to fully charge a battery (e.g. lead acid battery), and improving finishing or topping-off the charging of the battery.

The presently described subject matter is directed to a dynamic battery charging method for use in a battery charger configured to charge a lead acid battery, the method comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery.

The presently described subject matter is directed to a dynamic battery charging method for use in a battery charger configured to charge a lead acid battery, the method comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery, wherein the time interval is a fixed length time interval.

The presently described subject matter is directed to a dynamic battery charging method for use in a battery charger configured to charge a lead acid battery, the method comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery, wherein the time interval is a fixed length time interval and wherein the fixed length time interval can be varied or set to a different fixed length time interval before or during charging operation.

The presently described subject matter is directed to a dynamic battery charging method for use in a battery charger configured to charge a lead acid battery, the method comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery, wherein the time interval is a fixed length time interval, wherein the fixed length time interval is five (5) minutes.

The presently described subject matter is directed to a dynamic battery charging method for use in a battery charger configured to charge a lead acid battery, the method comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery, wherein a length of the time interval can vary in a sequence during charging operation.

The presently described subject matter is directed to a dynamic battery charging method for use in a battery charger configured to charge a lead acid battery, the method comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery, wherein the multiple operating current samples are taken at fixed lengths of time.

The presently described subject matter is directed to a dynamic battery charging method for use in a battery charger configured to charge a lead acid battery, the method comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery, wherein the multiple operating current samples are taken at fixed lengths of time, and wherein the fixed length of time is one (1) second.

The presently described subject matter is directed to a dynamic battery charging method for use in a battery charger configured to charge a lead acid battery, the method comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery, wherein the multiple operating current samples are taken at a timed sequence.

The presently described subject matter is directed to a dynamic battery charging method for use in a battery charger configured to charge a lead acid battery, the method comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery, wherein the multiple operating current samples are taken at a timed sequence, and wherein the timed sequence comprises a sequence of fixed time intervals and/or varying time intervals.

The presently described subject matter is directed to a dynamic battery charging method for use in a battery charger configured to charge a lead acid battery, the method comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery, wherein the CV phase is terminated once the Delta Current is less than or equal to the particular current level of 40 mA.

The presently described subject matter is directed to a dynamic battery charging method for use in a battery charger configured to charge a lead acid battery, the method comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery, wherein the CV phase is terminated once the Delta Current is less than or equal to the particular current level of 40 mA, and wherein the particular battery charger operating current is 1-2 amps.

The presently described subject matter is directed to a dynamic battery charging method for use in a battery charger configured to charge a lead acid battery, the method comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery, wherein the CV Time occurs when the value of the operating current meets a CV exit threshold.

The presently described subject matter is directed to a dynamic battery charging method for use in a battery charger configured to charge a lead acid battery, the method comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery, wherein instead the CV phase is terminated when a set level of optimization current is met.

The presently described subject matter is directed to a dynamic battery charging method for use in a battery charger configured to charge a lead acid battery, the method comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery, wherein instead the CV phase is terminated when a set level of optimization current is met, and wherein a CC optimization current to be used is a value of the operating current when the battery charger exited the CV phase.

The presently described subject matter is directed to a dynamic battery charging method for use in a battery charger configured to charge a lead acid battery, the method comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery, wherein the additional voltage amount is 500 mV.

The presently described subject matter is directed to a dynamic battery charging method for use in a battery charger configured to charge a lead acid battery, the method comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery, wherein instead the CV phase is terminated when a set level of optimization current is met.

The presently described subject matter is directed to a battery charger, including or incorporating a dynamic battery charging method, comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery.

The presently described subject matter is directed to a battery charger, including or incorporating a dynamic battery charging system using or incorporating a dynamic battery charging method, comprising or consisting of: marking a time when the battery charger switches from a Constant Current (CC) phase to a Constant voltage (CV) phase to establish a CV Start Time; starting at the CV Start Time, begin measuring at successive time intervals an operating current of the battery charger by averaging multiple operating current samples taken during one or more successive time intervals; calculating a Delta Current by subtracting a current measurement at a particular time interval from a previous current measurement at an earlier time interval; terminating the CV phase once the Delta Current is less than or equal to a particular Delta Current current level OR once the battery charger operating current drops below a particular battery charger operating current; marking a CV Finish Time when the battery charger terminates the CV phase; switching back to another CC phase once the CV phase is terminated; and staying at the another CC phase for a time period equal to the CV Finish Time minus the CV start Time OR until the lead acid battery reaches CV voltage plus an additional voltage amount to complete charging of the lead acid battery

BRIEF DESCRIPTION OF DRAWINGS

FIG. 1 is a flow chart showing the Dynamic Battery Charging method according to the present invention.

DETAILED DESCRIPTION

Most smart battery chargers use "fixed time methods" to finish or top-off charge on Lead Acid batteries. They include fixed current thresholds.

The Dynamic Charging method according to the present invention is shown in FIG. 1. The Dynamic Charging method allows this threshold to be variable by doing a DI/DT calculation as follows:

1) Mark time when charger switches from Constant Current (CC) to Constant voltage (CV) (start of Absorption)–CV Start time;
2) Starting at CV Start Time—At 5 minute intervals (this length of the time interval can vary)—measure charger current by averaging current samples spaced 1 second apart;
3) Calculate the Delta Current—Subtract the current 5 minute measurement from the previous 5 minute charger current measurement.
4) Terminate the CV phase once the Delta Current is less than or equal to 40 mA (this current level can vary) OR once the charger current drops below 1-2 Amps (this current level can vary). Mark the time when the charger terminates the CV phase as CV Finish Time. Note the value of the current once the CV exit threshold is met;
5) The charger will then switch back to CC mode (optimization) once the above threshold has been met.

Instead, a set level of optimization current can be used (it is desired that the CC optimization current to be used is the value of the current when the charger exited the CV phase in the above step); and 6) It is desired to stay at the CC level for a time=(CV Finish Time−CV start Time) OR until the battery reaches (CV voltage+500 mV (temperature compensated). At this point the charge is considered complete.

The invention claimed is:

1. A dynamic battery charging method for use in a battery charger configured to charge a lead acid battery, the method comprising:
    marking a time when the battery charger switches from a Constant Current (CC) phase to a Constant voltage (CV) phase to establish a CV Start Time;
    starting at the CV Start Time, begin measuring at successive time intervals an operating current of the battery charger by averaging multiple operating current samples taken during one or more successive time intervals;
    calculating a Delta Current by subtracting a current measurement at a particular time interval from a previous current measurement at an earlier time interval;
    terminating the CV phase once the Delta Current is less than or equal to a particular Delta Current current level OR once the battery charger operating current drops below a particular battery charger operating current;
    marking a CV Finish Time when the battery charger terminates the CV phase;
    switching back to another CC phase once the CV phase is terminated; and
    staying at the another CC phase for:
        a time period equal to the CV Finish Time minus the CV Start Time;
        or
        a time period from the CV Finish Time until the lead acid battery reaches CV voltage plus a predetermined voltage amount to complete charging of the lead acid battery.

2. The method according to claim 1, wherein the time interval is a fixed length time interval.

3. The method according to claim 2, wherein the fixed length time interval can be varied or set to a different fixed length time interval before or during charging operation.

4. The method according to claim 2, wherein the fixed length time interval is five (5) minutes.

5. The method according to claim 1, wherein a length of the time interval can vary in a sequence during charging operation.

6. The method according to claim 1, wherein the multiple operating current samples are taken at fixed lengths of time.

7. The method according to claim 6, wherein the fixed length of time is one (1) second.

8. The method according to claim 1, wherein the multiple operating current samples are taken at a timed sequence.

9. The method according to claim 8, wherein the timed sequence comprises a sequence of fixed time intervals and/or varying time intervals.

10. The method according to claim 1, wherein the CV phase is terminated once the Delta Current is less than or equal to the particular current level of 40 mA.

11. The method according to claim 10, wherein the particular battery charger operating current is 1-2 amps.

12. The method according to claim 1, wherein the CV Time occurs when the value of the operating current meets a CV exit threshold.

13. The method according to claim 1, wherein instead the CV phase is terminated when a set level of optimization current is met.

14. The method according to claim 13, wherein a CC optimization current to be used is a value of the operating current when the battery charger exited the CV phase.

15. The method according to claim 1, wherein the predetermined voltage amount is 500 mV.

16. A battery charger configured to perform a dynamic battery charging method for use in charging a lead acid battery, the method comprising:
    marking a time when the battery charger switches from a Constant Current (CC) phase to a Constant voltage (CV) phase to establish a CV Start Time;
    starting at the CV Start Time, begin measuring at successive time intervals an operating current of the battery charger by averaging multiple operating current samples taken during one or more successive time intervals;
    calculating a Delta Current by subtracting a current measurement at a particular time interval from a previous current measurement at an earlier time interval;
    terminating the CV phase once the Delta Current is less than or equal to a particular Delta Current current level OR once the battery charger operating current drops below a particular battery charger operating current;
    marking a CV Finish Time when the battery charger terminates the CV phase;
    switching back to another CC phase once the CV phase is terminated; and
    staying at the another CC phase for:
        a time period equal to the CV Finish Time minus the CV Start Time;
        or
        a time period from the CV Finish Time until the lead acid battery reaches CV voltage plus a predetermined voltage amount to complete charging of the lead acid battery.

17. The battery charger of claim 16, further comprising a battery charging system using or incorporating the dynamic battery charging method.

* * * * *